US006714902B1

United States Patent
Chao et al.

(12) United States Patent
(10) Patent No.: US 6,714,902 B1
(45) Date of Patent: Mar. 30, 2004

(54) METHOD AND APPARATUS FOR CRITICAL AND FALSE PATH VERIFICATION

(75) Inventors: Han-Hsun Chao, Westford, MA (US); Rahul Razdan, Princeton, MA (US); Alexander Saldanha, El Cerrito, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/517,654

(22) Filed: Mar. 2, 2000

(51) Int. Cl.[7] .............................................. G06F 17/50
(52) U.S. Cl. .............................. 703/14; 703/13; 703/15; 703/19; 716/6
(58) Field of Search ............................. 703/14, 15, 19, 703/13; 716/6, 4, 5; 714/30; 712/200, 300, 209

(56) References Cited

U.S. PATENT DOCUMENTS

| | | | |
|---|---|---|---|
| 4,527,249 A | | 7/1985 | Van Brunt |
| 4,722,071 A | * | 1/1988 | Gates et al. .................. 700/12 |
| 4,924,430 A | | 5/1990 | Zasio et al. |
| 5,095,454 A | | 3/1992 | Huang |
| 5,191,541 A | | 3/1993 | Landman et al. |
| 5,355,321 A | | 10/1994 | Grodstein et al. |
| 5,600,787 A | * | 2/1997 | Underwood et al. .......... 714/30 |
| 5,648,909 A | * | 7/1997 | Biro et al. ....................... 716/6 |
| 5,657,239 A | * | 8/1997 | Grodstein et al. .............. 716/6 |
| 5,805,459 A | * | 9/1998 | Kapoor .......................... 703/14 |
| 5,946,475 A | * | 8/1999 | Burks et al. .................... 716/6 |
| 6,026,222 A | | 2/2000 | Gupta et al. |
| 6,086,626 A | * | 7/2000 | Jain et al. ....................... 716/5 |
| 6,097,884 A | * | 8/2000 | Sugasawara .................... 716/4 |
| 6,286,126 B1 | * | 9/2001 | Raghavan et al. .............. 716/6 |

OTHER PUBLICATIONS

Smith, "Fault detection test derivation using Boolean difference tchniques", ACM 1972.*
McGeer et al., "Efficient algorithms for computing the longest viablee path in a combinational network", ACM 1989.*

(List continued on next page.)

Primary Examiner—Samuel Broda, Esq.
Assistant Examiner—Kandasamy Thangavelu
(74) Attorney, Agent, or Firm—Reed Smith LLP; John W. Carpenter

(57) ABSTRACT

A method and apparatus for critical and false path verification takes all the potential false paths and captures the conditions that would make them true paths (or false paths) as a Boolean expression (net list), for the combinational logic only. The net list does not have to be at the gate level, but can be a simplified gate level representation because the verification process is only concerned with the logical behavior, not the actual structure. This allows the simulation to execute more quickly. Since the conditions are only captured between register elements, it can be formally proved whether or not the path can be exercised. If no register value can activate the path, then the analysis is done. Otherwise, a simulation is performed to determine whether the register values required to active the condition actually occur. If the Boolean condition can be satisfied, the simulation is performed on the sequential logic to justify those values. If the satisfiability engine fails to finish, then the simulation is run on the combinatinal logic, and an attempt is made to justify the values sequentially as well.

22 Claims, 17 Drawing Sheets

OTHER PUBLICATIONS

Jayabharathi et al., "A novel solution for chip level functional timing verification", 15$^{th}$ IEEE VLSI Test symposium, Apr.–May, 1997.*

Benkoski et al., "Timing verification using statically sensitizable paths", IEEE Transactions on computer aided design of Integrated circuits, Oct. 1990.*

Abdallah et al., "New algorithms for static and dynamic sensitization of paths in timing analysis", Proceedings of the 26$^{th}$ Southeastern Symposium on System theory, Mar. 1994.*

Ringe et al., "Path verification using Boolean satisfiability", Proceedings of design, automation and test in Europe, 1998.*

Fang et al., "timing optimization by gate resizing and critical path identification", IEEE Transactions on computer aided design of integrated circuits and systems, Feb. 1995.*

Du et al., "On the general false path problem in timing analysis", 26th design automation conference, 1989.*

Benkowski et al., "Role of timing verification in layout synthesis", Proceedings of the 28th ACM/IEEE design automation conference, Jun. 1991.*

R.B. Hitchcock, et al. "Timing Analysis of Computer Hardware," IBM Journal of Research and Development, vol. 26, No. 1, pp. 100–105, Jan. 1982.

J. Benkoski et al. "Efficient algorithms for solving the false path problem in timing verification," Proc. Of ICCAD–87, pp. 44–47, Jun. 1987. (IEEE).

P.C. Mcgeer, A. Saldanha, R.K. Brayton, and A. Sangiovanni–Vincentelli, "Delay models and exact timing analysis," T. Sasao, editor, Logic Synthesis and Optimization, pp. 167–189, Kluwer Academic Publishers, 1993.

S. Devdas, et al. "Computation of floating mode delay in combinational circuits: Theory and algorithms," IEEE Trans. On CAD, pp. 1913–1923, Dec. 1993, (IEEE).

D. Du et al., "On the general false path problem in timing analysis," Proc. Of 26th DAC, 1989, pp. 555–560. (ACM).

P.C. McGeer and R.K. Brayton, "Integrating Functional and Temporal Domains in Logic Design," Kluwer Academic Publishers, 1991.

Y. Kukimoto and R.K. Brayton, "Exact Required Time Analysis via False Path (ACM) Detection," Proc. Of 34th Design Automation Conference, pp. 220–225, Jun. 1997.

Kunz, et al. Recursive Learning: A New Implication Technique for Efficient Solutions to CAD Problems–Test, Verification, and Optimization. IEEE Trans. Comp. Aided Design of Ics and Systems. Sep. 1994, pp. 1143–1158.

Silva, et al. Realistic Delay Modeling in Satisfiability–Based Timing Analysis. ISCAS '98. May 1998, pp. 215–218.

Marques–Silva, et al. A Search Algorithm for Propositional Satisfiability. IEEE Trans. Computers. May 1999, pp. 506–521.

Copy of International Search Report.

\* cited by examiner topological path delay   c - d - e - z      =9
true path delay   c - d - e - z              =(8)

(*) The default mode is Static Sense Checking.
(**) Required for floating mode computations.
(***) The netlist contains aborted and sensitizable conditions.

```
module foo_cfpv( );
top top( );
reg cfpvx2$0;
reg cfpvx2$1;
reg cfpvx3$0;
reg cfpvx3$1;
reg cfpvx4$0;
reg cfpvx4$1;
reg cfpvx1$0;
reg cfpvx1$1;
integer cfpv$betacnt;
integer cfpv$gamacnt;

initial
begin
cfpv$betacnt=2;
cfpv$gamacnt=2;
end always @( posedge top.foo.clk)
begin
cfpvx1$0 <= cfpvx1$1;
cfpvx1$1 = top.foo.x1;
cfpvx2$0 <= cfpvx2$1;
cfpvx2$1 = top.foo.x2;
cfpvx3$0 <= cfpvx3$1;
cfpvx3$1 = top.foo.x3;
cfpvx4$0 <= cfpvx4$1;
cfpvx4$1 = top.foo.x4;
end not mod1(k,top.foo.x1);
and mod2(p,top.foo.x2,top.foo.x3);
or mod3(beta,k,top.foo.x2);
xor mod4(gamma,p,top.foo.x4);

always @(beta= = =1 && cfpv$betacnt>0)
begin
cfpv$betacnt = cfpv$betacnt-1;
$display("beta is activated at time %d',$time);
$display("input vector top.foo.x1 = %d, top.foo.x2 = %d', cfpvx1$1,cfpvx2$1);
end always @(gamma = = =1 && cfpv$gammacnt>0)
begin
cfpv$gammacnt = cfpv$gammacnt-1;
$display("gamma is activated at time %d',$time);
$display("input vector top.foo.x2=%d, top.foo.x3=%d, top.foo.x4=%d",
cfpvx2$1, cfpvx3$1, cfpvx4$1);
end
endmodule;
```

FIG. 18

METHOD AND APPARATUS FOR CRITICAL AND FALSE PATH VERIFICATION

BACKGROUND OF THE INVENTION

1. Field of the Invention

The present invention relates generally to the field of digital system design and verification, and more particularly to an apparatus and method for identifying true and false signal paths in digital circuits.

2. Description of the Related Art

Modern digital systems contain extremely complex circuitry and have tight timing constraints. Verifying the functional and timing correctness of these systems, within the ever-shorter design cycle-time, represents a major challenge to circuit designers. Traditionally, functional and timing verifications were performed using the same tool and on the same level of design representation. In fact, in order to accurately predict timing, lower-level representations, such as gate or transistor levels, should be used. Functional verification, on the other hand, is preferably performed at higher levels of abstraction, such as RTL. Thus, from the design tool perspective, the separation of functional and timing verification enables the development of much faster and more complete algorithms for each problem.

In order to improve verification productivity, state-of-the-art verification methodologies separate the timing verification from the functional verification. Typically such a methodology uses a delay-independent functional simulation tool, or cycle-simulator, to verify the functionality of the design at the RTL level. A static timing analyzer is used to verify the timing at the gate or transistor level. An equivalence checker is then used to confirm that both tools are verifying the same logically equivalent design.

An illustration of this process is shown in FIG. 1, with respect to a sample RTL design flow. An RTL file 8 is input to a cycle simulator 2 for functional verification. The RTL file is also synthesized by a logic synthesis block 10 into a gate level design 12. The gate level design is then input to a static timer 4, along with timing control information 16, for timing verification. The static timer 4 outputs a timing report 14. Both the RTL design 8 and the gate level design 12 are input to a formal equivalence block 6 to verify that both designs are logically equivalent.

The static timing analyzer is input-vector independent and thus has a "completeness" advantage over other timing simulations. Also, by ignoring the functionality of the designs, fast graph search algorithms can be used to identify the timing critical paths. Unfortunately, the trade-off for not considering the actual logic function during timing analysis is pessimism introduced due to false paths. A false path is a circuit path that will never actually propagate a signal value or be used in the real circuit, due to the function of the combinational and/or sequential logic circuits. This pessimism can lead to over design due to optimizing for a false-path. Additionally, this optimization for a false path can lead to design trade-offs that actually worsen the true critical paths of the circuit. Consider for example the circuit of FIG. 2. The topological path delay for path c-d-e-z is 10, whereas the true path delay a-e-z is 7. If the timing is optimized based on the topological delay, then the connections between a and c are swapped, as shown in FIG. 3. After optimization, the topological delay has improved from 10 to 9, but the true delay has degraded from 7 to 8.

In further detail, existing approaches to timing verification can be grouped into three categories: Timing Simulation, Static Timing Analysis (STA), and Functional Timing Analysis (FTA). The Timing Simulation methods verify timing by simulating a circuit based on a set of input vectors specified by the circuit designer. The input vectors are applied to the circuit and responses are collected and compared to the intended results. This is the most accurate method among the existing approaches. However, there are several drawbacks to this approach, namely:

1. A set of test vectors is required, the generation of which is a labor intensive process. 2. In order to completely verify the circuit, the circuit must be simulated with all possible input vectors. Due to the tremendous number of such vectors, usually only a small portion of the set is exercised. Thus, both computation time and completeness of the verification are practical problems with this approach.

To alleviate the run time problems associated with timing simulations, other more efficient approximation methods have been proposed. At one end of the spectrum is topological timing analysis, or Static Timing Analysis (STA), an example of which is disclosed in U.S. Pat. No. 4,924,430, entitled STATIC TIMING ANALYSIS OF SEMICONDUCTOR DIGITAL CIRCUITS. This method effectively ignores the logical function of the design and assumes the worst possible delays throughout the system. Because only the topological analysis is performed for the computation, and the method is input vector independent, the STA method is very fast. Graph based algorithms can used, which are time linear with the circuit size. However, the STA method is also pessimistic since it does not take logic information into consideration, and thus the results may include false paths.

The Functional Timing Analysis criteria extend the STA method by considering both the logical behaviors and the timing characteristics of the circuits. The FTA method is based on formal methods and therefore is complete. Depending on the assumptions concerning the signal propagation criteria, the FTA method can provide accurate results. However, the FTA formulations require the solution of a Boolean satisfiability problem. The Boolean satisfiability problem is NP-complete, and thus run-time performance and memory requirements are major practical obstacles. The solution of Boolean satisfiability problems for combinational logic is well known in the art, and existing algorithms usually work well in practice. See, for example, "Algorithms for Satisfiability Problems in Combinational Switching Circuits," Joao da Silva, Ph.D. Thesis, University of Michigan, 1995. However, to correctly identify the true delay of a complex circuit, the sequential behavior of the circuit also needs to be analyzed.

Almost all of the previously proposed approaches for verification deal with combinational logic only. This implies that all possible input vectors will occur during normal system operation. In a real system, however, not all input vectors are reachable during normal system operations. For example, in FIG. 4, under normal circuit operation A and B are never at logic 1 at the same time. Accordingly, the path P-T-Z is a false path. Thus, the algorithms that rely only on the combinational logic are pessimistic (i.e. potentially too negative).

In view of the foregoing, it would be desirable to have a method and apparatus for critical and false path verification that analyzes sequential logic flow as well as combinational logic, thereby providing a more thorough, and less pessimistic, verification procedure.

SUMMARY OF THE INVENTION

In general, the present invention is an apparatus and method for identifying true and false signal paths in digital circuits. The present approach utilizes the fact that a static sensitization criteria, which may be optimistic, provides a lower bound on the true delay of a system. Since the result of the static timing analyzer is an absolute upper bound on delay, if the upper bound and lower bound are equal then a true delay has been found. When the differences between the two bounds is too large, the present invention uses the results of a floating mode algorithm as the upper bound instead.

Since it is not practically feasible to analyze false paths within a formal sequential verification framework, the present invention produces an assertion module that contains the conditions for which paths under consideration may be activated. The assertion module can then be used in conjunction with functional verification to check the validity of potentially false paths. Note that the formal approaches used in the bounded algorithm assume all input vectors are valid. Thus, if the algorithm cannot find any vector to activate a path, there is no need for further simulation.

In other words, the present invention takes all the potential false paths and captures the conditions that would make them true paths as a Boolean expression (net list), for the combinational logic only. The net list does not have to be at the gate level, but can be a simplified gate level representation because the verification process is only concerned with the logical behavior, not the actual structure. This allows the simulation to execute more quickly. Since the conditions are only captured between register elements, it can be formally proved whether or not the path can be exercised. If no register value can activate the path, then the analysis is done. Otherwise, a simulation is performed to determine whether the register values required to active the condition actually occur. If the Boolean condition can be satisfied, the simulation is performed on the sequential logic to justify those values. If the satisfiability engine fails to finish, then the simulation is run on the combinatinal logic, and an attempt is made to justify the values sequentially as well.

The present system has two main applications—(1) to verify that the false paths specified by a circuit designer are indeed false (or not true), and (2) to verify that the critical paths computed by the static timer analyzer (STA) are not false paths. Also, test vectors, at the combinational level, that can be used to exercise the critical paths are generated as a by-product. The core of the system, namely the bounded false path determination algorithm and the assertion generation, are the same for both applications.

These and other aspects of the invention, as well as further details of specific embodiments, may be more fully understood from the following specification and drawings.

BRIEF DESCRIPTION OF THE DRAWINGS

The present invention will be readily understood by the following detailed description in conjunction with the accompanying drawings, wherein like reference numerals designate like structural elements, and in which:

FIG. 18 shows the assertion module in Verilog format for the example circuit.

DETAILED DESCRIPTION OF THE INVENTION

Figure 1:
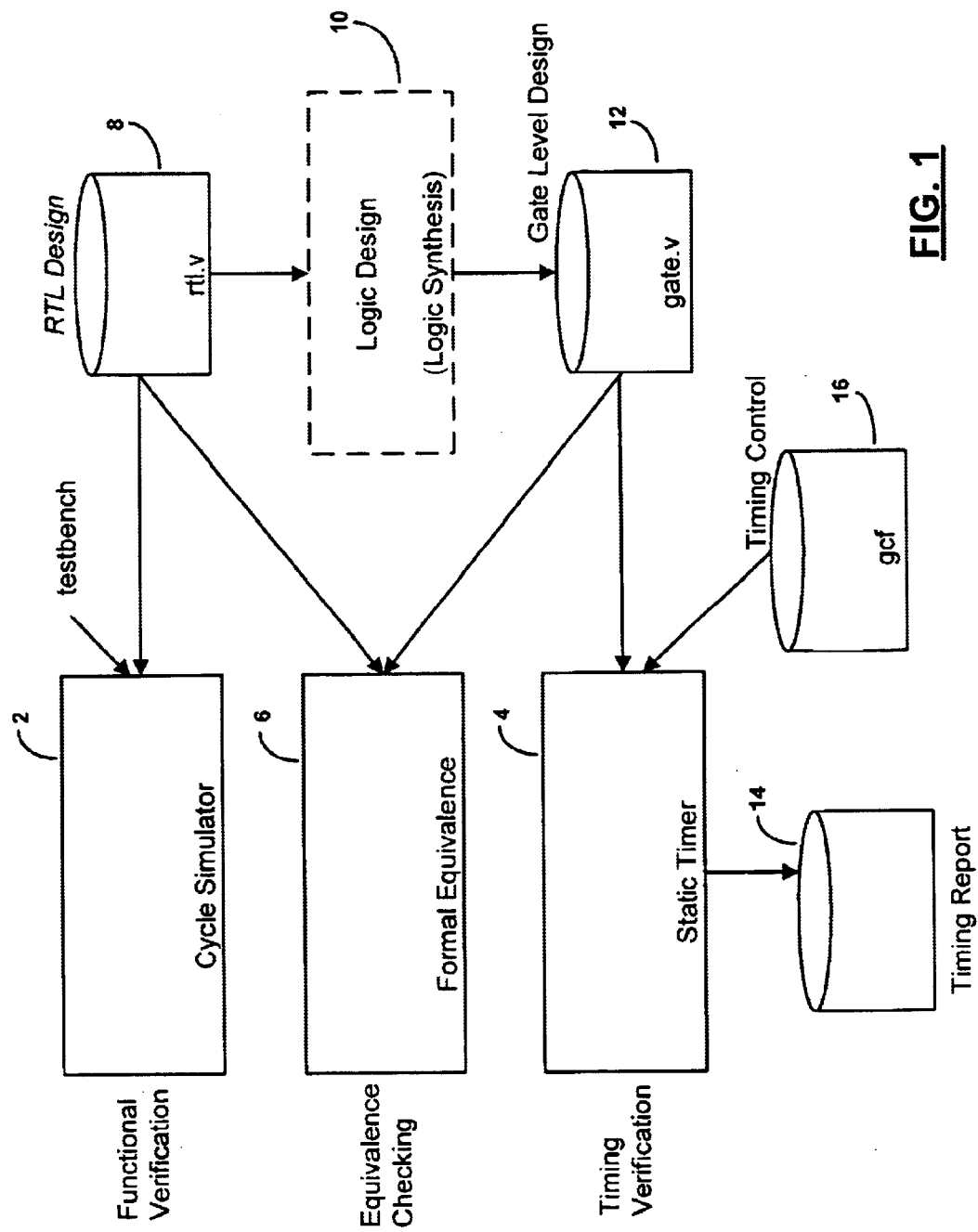
FIG. 1 is a block diagram of a verification methodology having separate timing verification and functional verification.
Figure 2:
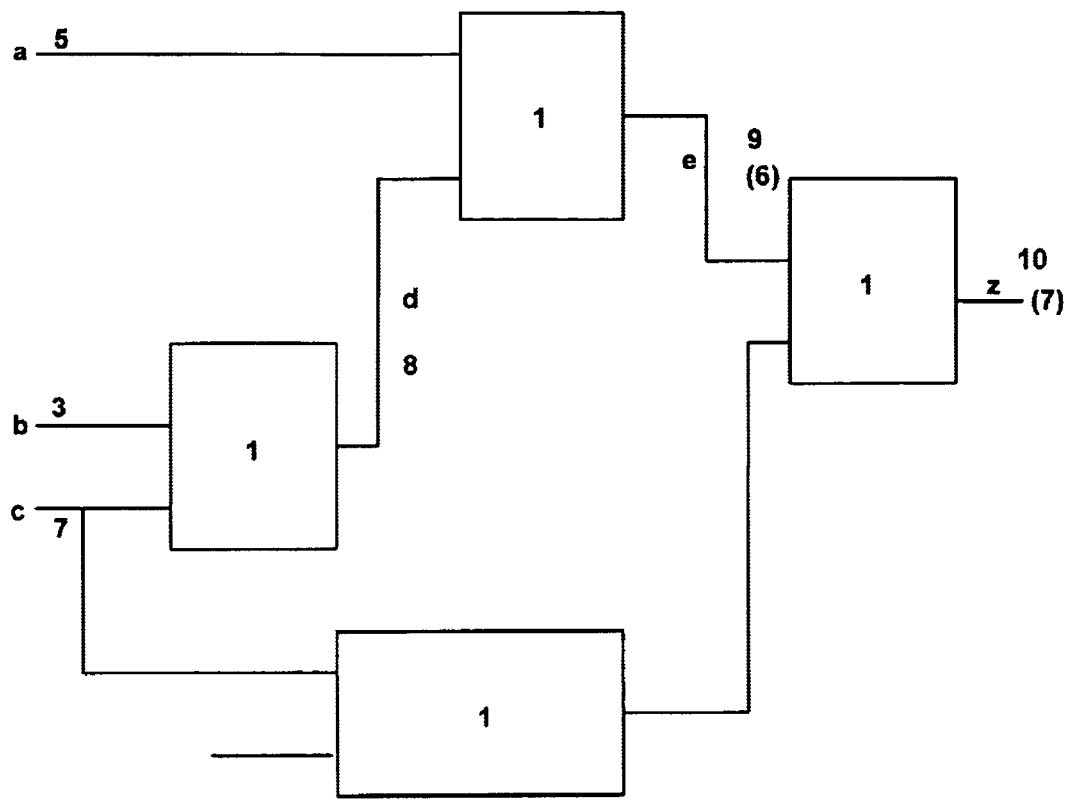
FIG. 2 is a diagram of a logic circuit showing the calculations of a topological path delay and a true path delay.
Figure 3:
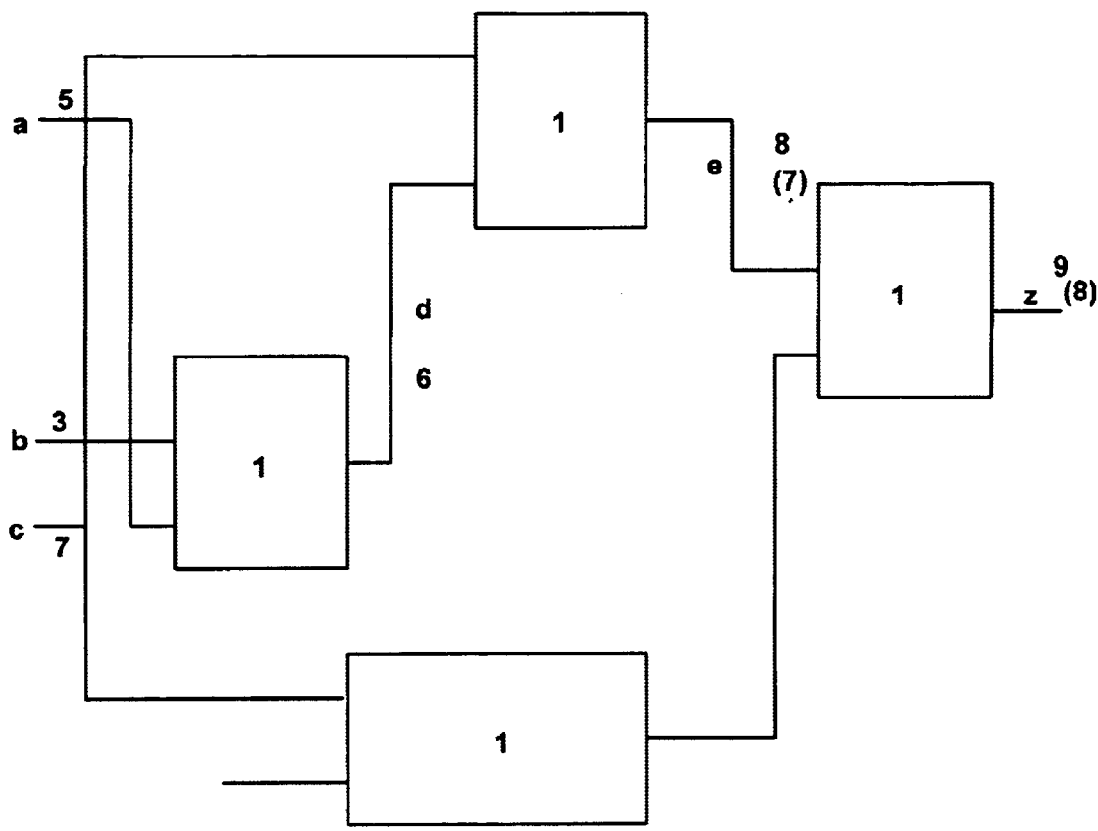
FIG. 3 is a diagram of the circuit of FIG. 2 showing path delays after a timing optimization based on the topological delay.
Figure 4:
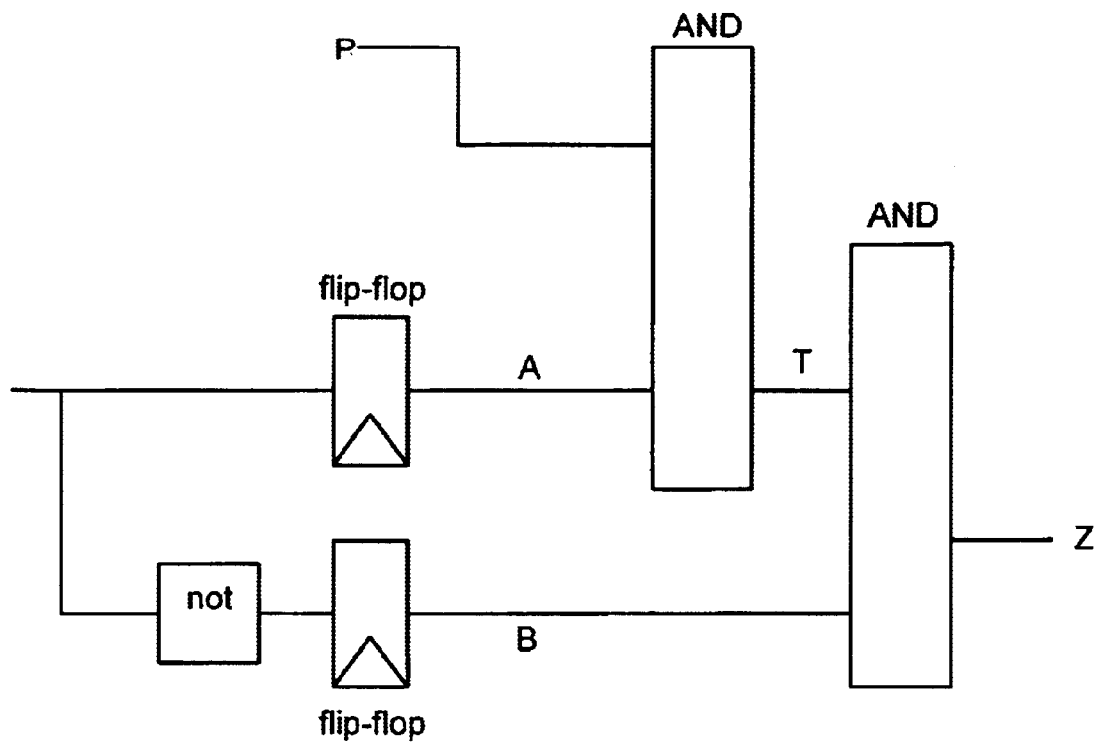
FIG. 4 is a diagram of logic circuit illustrating a false path.

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a method and apparatus for critical and false path verification. Any and all such modifications, equivalents and alternatives are intended to fall within the spirit and scope of the present invention.

In general, the present invention is an apparatus and method for identifying true and false signal paths in digital circuits. The present approach utilizes the fact that the static sensitization criteria, which may be optimistic, provides a lower bound on the true delay of a system. Since the result of the static timing analyzer is an absolute upper bound on delay, if the upper bound and lower bound are equal then a true delay has been found. When the differences between the two bounds is too large, the present invention uses the results of a floating mode algorithm as the upper bound instead.

Since it is not practically feasible to analyze false paths within a formal sequential verification framework, the present invention produces an assertion module that contains the conditions for which paths under consideration may be activated. The assertion module can then be used in conjunction with functional verification to check the validity of potentially false paths. Note that the formal approaches used in the bounded algorithm assume all input vectors are valid. Thus, if the algorithm cannot find any vector to activate a path, there is no need for further simulation.

The present invention takes all the potential false paths and captures the conditions that would make them true paths as a Boolean expression (net list), for the combinational logic only. The net list does not have to be at the gate level, but can be a simplified gate level representation because the verification process is only concerned with the logical behavior, not the actual structure. This allows the simulation to execute more quickly. Since the conditions are only captured between register elements, it can be formally proved whether or not the path can be exercised. If no register value can activate the path, then the analysis is done. Otherwise, a simulation is performed to determine whether the register values required to active the condition actually occur. If the Boolean condition can be satisfied, the simulation is performed on the sequential logic to justify those values. If the satisfiability engine fails to finish, then the simulation is run on the combinatinal logic, and an attempt is made to justify the values sequentially as well. This process is discussed in further detail below with reference to FIG. 7.

The present system has two main applications—(1) to verify that the false paths specified by a circuit designer are indeed false (or not true), and (2) to verify that the critical paths computed by the static timer analyzer (STA) are not false paths. Also, test vectors, at the combinational level, that can be used to exercise the critical paths are generated as a by-product. The core of the system, namely the bounded false path determination algorithm and the assertion generation, are the same for both applications. System inputs and outputs are slightly different between the two applications, however. In the first instance, false paths are specified as inputs, whereas in the second application true paths are specified as inputs.

Figure 5:
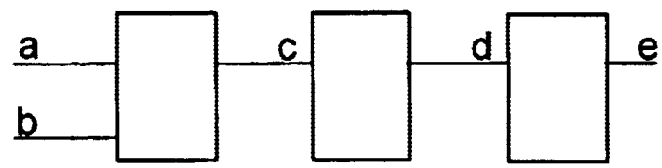
FIG. 5 is a diagram of path used to illustrate the definition of a disable.

The concept of a DISABLE will now be explained with reference to FIG. 5. A disable is a way of specifying paths that should be excluded from the Static Timing Analysis. For example, a static timer will build and trace the paths a-c-d-e and b-c-d-e for the circuit of FIG. 5. A DISABLE is used to direct the static timer to not trace a particular path, such as path a-c-d-e. One possible syntax is:
(DISABLE
  From (a)
  Through (c)
  Through (d)
  To (e)
)
The path b-c-d-e, however, would still be traced.

Figure 6:
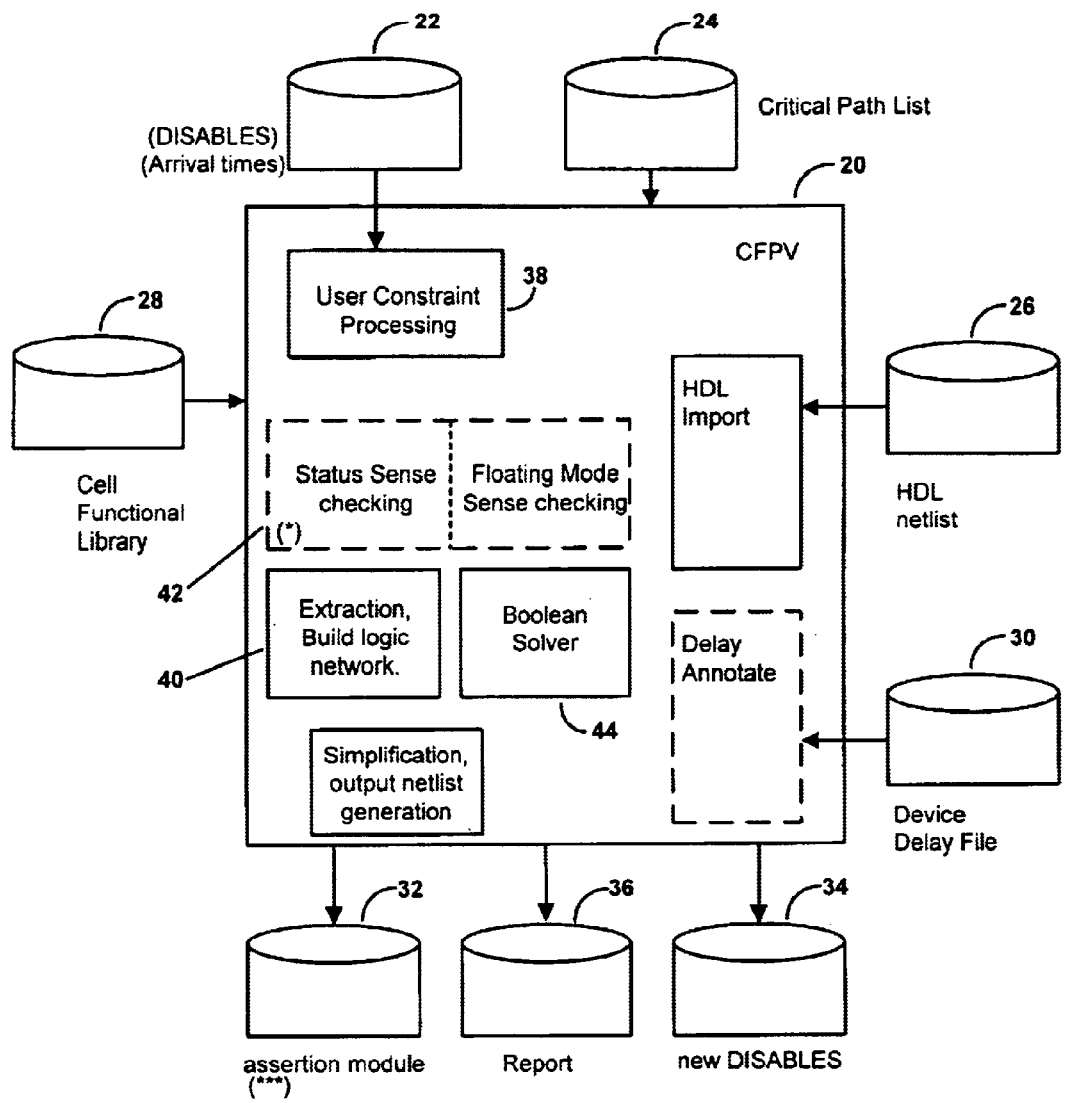
FIG. 6 a block diagram of an apparatus configured according to one embodiment of the present invention.

In further detail, FIG. 6 illustrates a block diagram of the present system 20. As seen in the figure, the inputs to the system are a list of disables 22, a list of critical paths 24, an HDL netlist 26 and its associated cell library 28, and a device delay file 30 which is needed for floating mode calculations. The outputs of the system are an assertion module 32, a list of new disables 34 which will be used in the next iteration of the static timing analysis, and a report 36 indicating which paths are false and which paths are true. The core of the system 20 consists of a disable processing section 38, an internal core engine 40, consisting of the machinery necessary to build the various analysis networks, a critical-path analysis engine 42, and a core Boolean solution network 44. The operation of these blocks for one path are described in detail below with reference to FIGS. 8–11. In the following discussion, one path is analyzed for simplicity, but the steps are applicable to processing a set of paths as well.

Figure 7A:
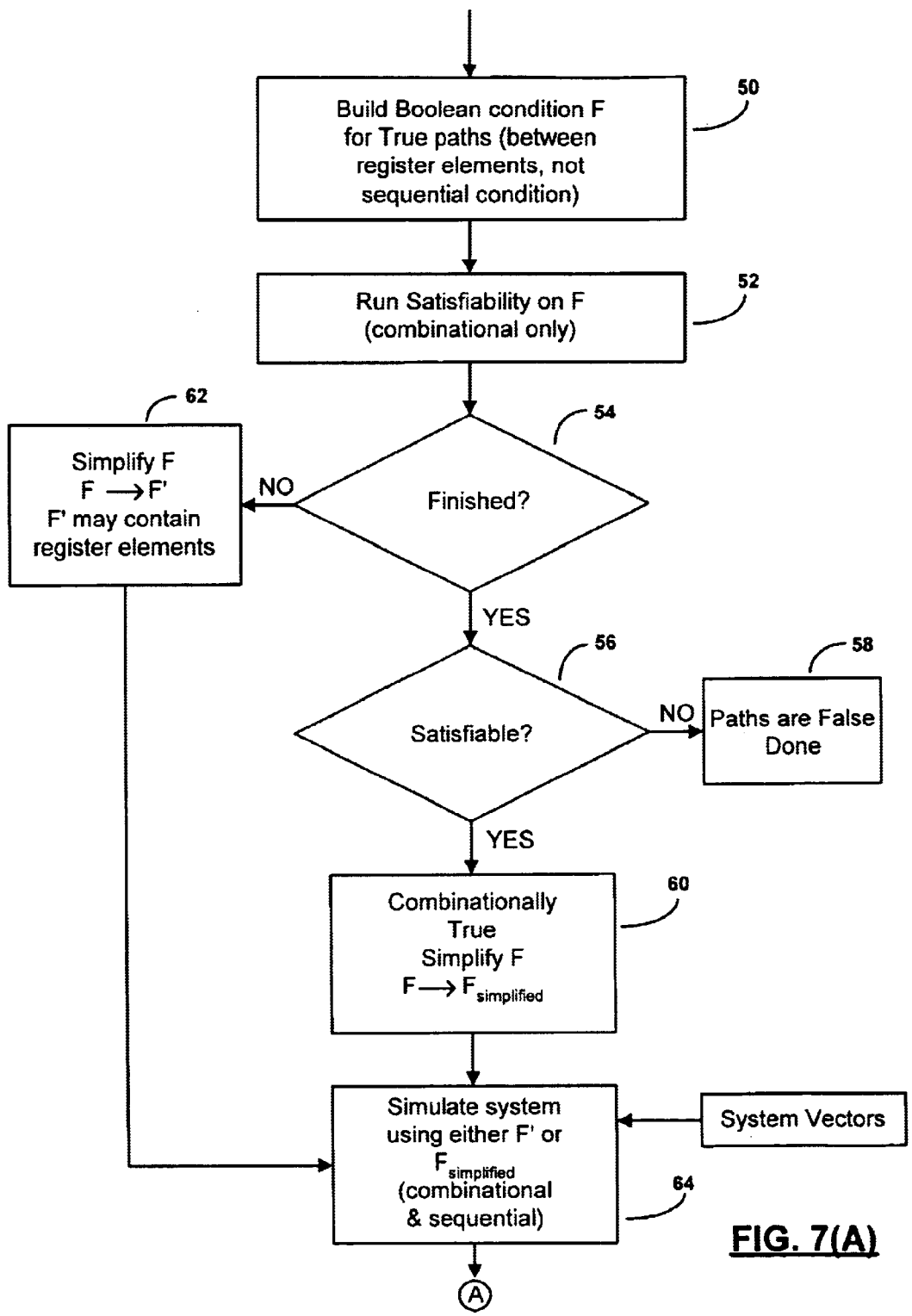
FIGS. 7(A) and 7(B) are a high-level flow diagram illustrating an embodiment of the present invention.
Figure 7B:
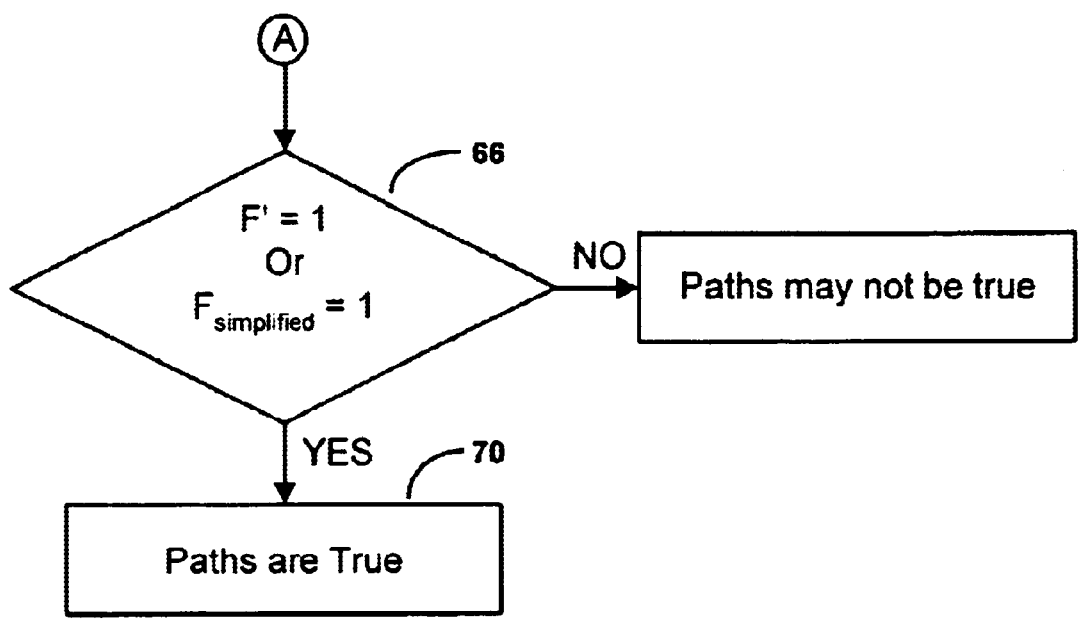
Figure 8:
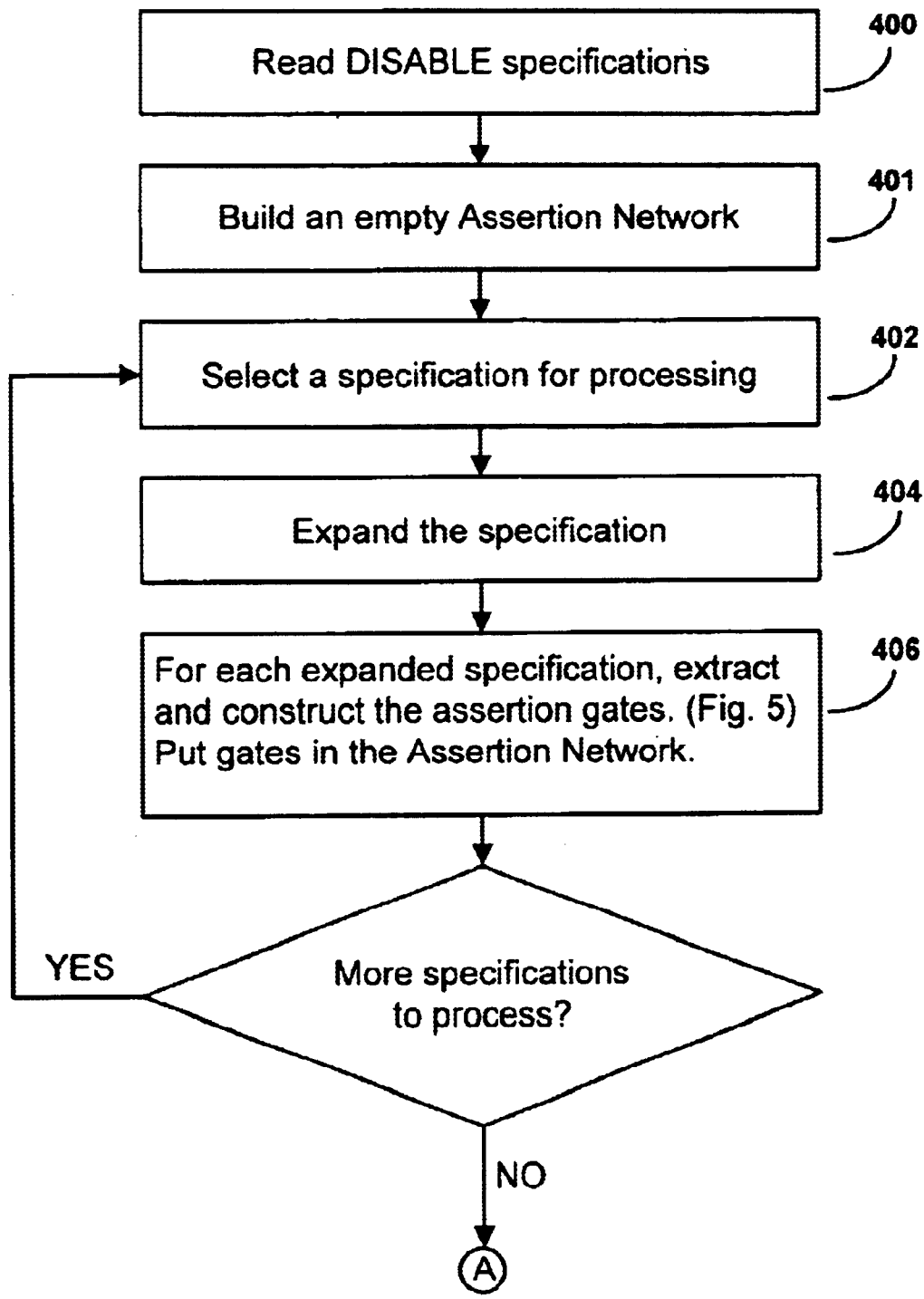
FIG. 8 a flowchart illustrating the operation of the disable processing.

FIGS. 7(A) and 7(B) are a high-level flow diagram of one embodiment of the present invention. First, at step 50, the circuit is analyzed to find the conditions under which a circuit is true (or false). Specifically, an abstraction F is created which presents a Boolean condition for all the possible input conditions, for the combinational logic only. If there are solutions for the Boolean expression F, then there is a true path, but if no input pattern satisfies the abstract expression, then the path is a false path (step 52). In one embodiment, the satisfiability test on F is run for 10 seconds with formal methods, according to known techniques. The amount of time allotted for the satisfiability test may be user controlled. If step 52 completes before the time limit (step 54), then a determination is made whether the Boolean condition F is satisfiable at step 56. If the Boolean condition F is not satisfiable, then the path is a false path (step 58), and no further processing is needed for the current path.

If the Boolean condition is satisfiable at step 56, then the path is combinationally true, and F is simplified further to an $F_{simplified}$ expression at step 60. If the satisfiability test could not finish within the time limit at step 54, then F is simplified to an F' expression, which may contain register elements, at step 62. The simplified expressions $F_{simplified}$ or F' are then simulated at step 64. Due to the abstraction, the simulation is able to execute much faster. If during the simulation, no input vector actually triggers the true path (step 66), then the system will probably never actually hit that state (step 68). Otherwise, if an input condition does satisfy the simplified Boolean expression, then the path is in fact a true path (step 70).

The detailed operation of the blocks of FIG. 6 will now be described with reference to FIGS. 8–11. The operation of the disable processing section of FIG. 6 is illustrated in greater detail by the flowchart of FIG. 8. First, a DISABLE specification is read in at step 400, and an empty Assertion Network is constructed at step 401. A specification is selected for processing (step 402) and then the specification is expanded (step 404). For each specification, the assertion gates are extracted, and the gates are put into the Assertion Network (step 406). If there are more specifications to process, step 402 is repeated, otherwise, processing continues to FIG. 9.

Figure 9:
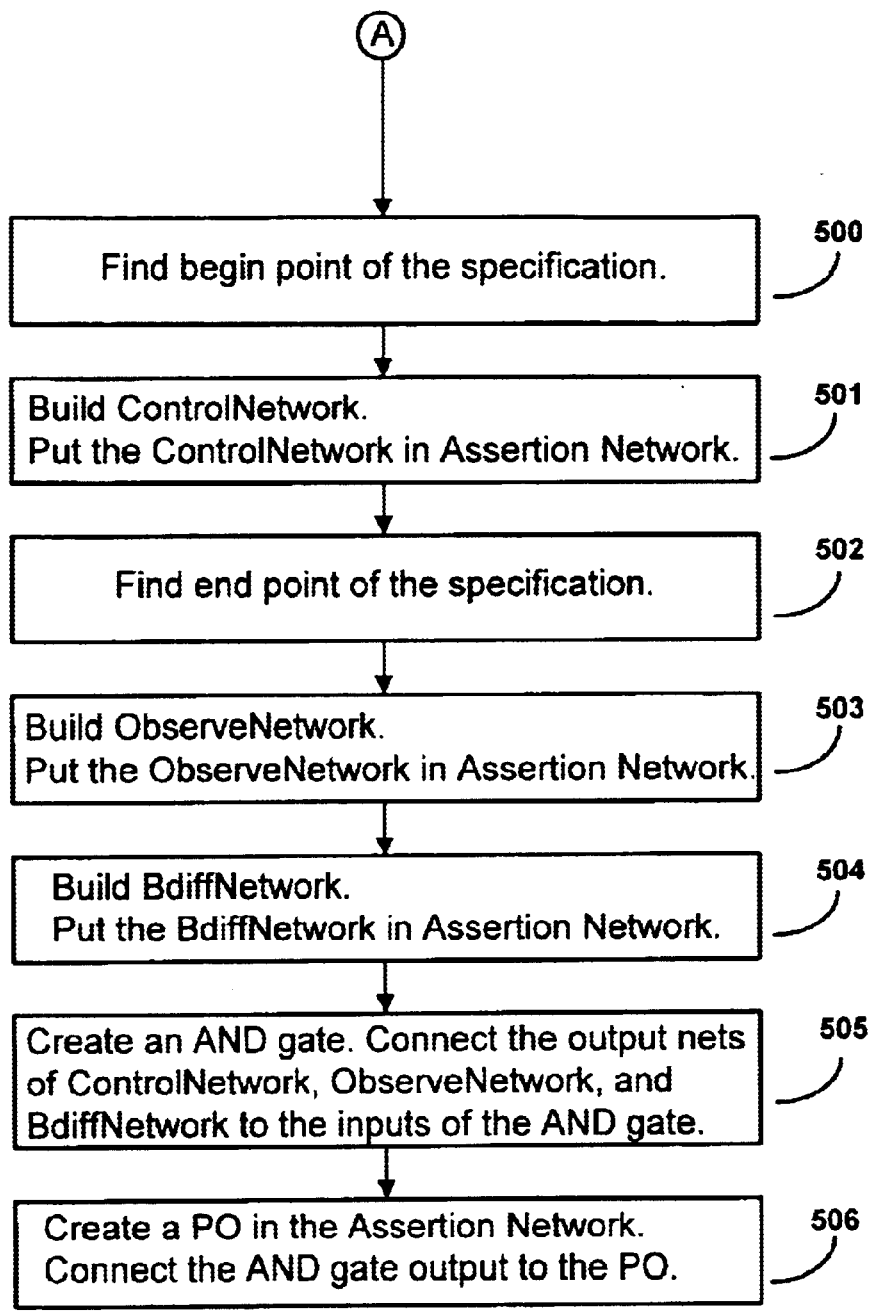
FIG. 9 is a flowchart illustrating the process to build the various analysis networks.

The process to build the various analysis networks is illustrated by the flowchart of FIG. 9. First, a begin point of the specification is found (step 501). A Control Network (described below) is built at step 501 and the Control Network is placed into the Assertion Network. Next, an end-point of the specification is found (step 502), and an Observe Network (described below) is constructed and placed into the Assertion Network (step 503). A Bdiff Network (described below) is also constructed and placed into the Assertion Network (step 504). The outputs of the ControlNetwork, ObserveNetwork, and BdiffNetwork are connected to an AND gate (step 505). A Primary Output (PO) is created in the Assertion Network, and the output of the AND gate is connected to the PO (step 506).

Figure 10:
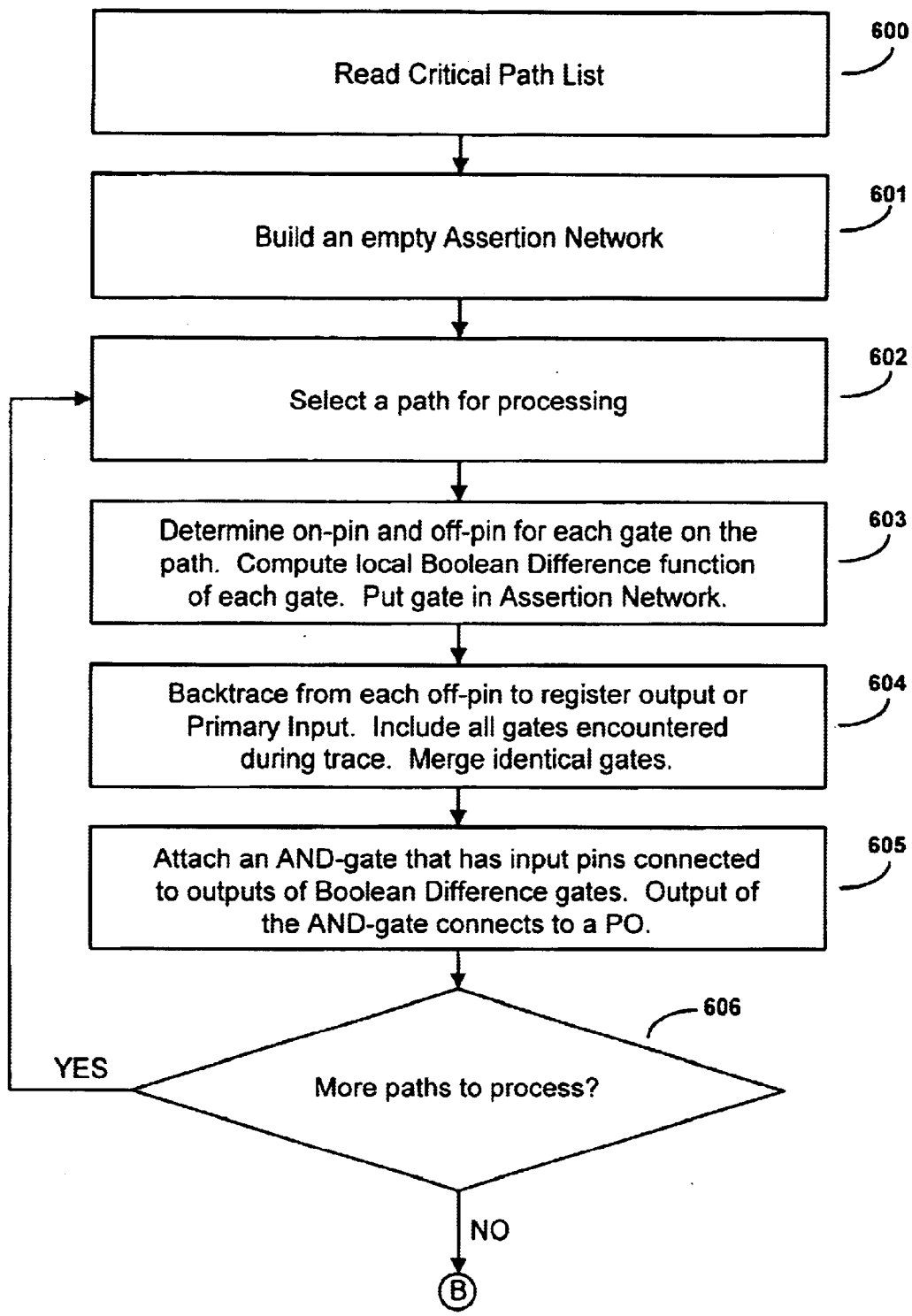
FIG. 10 is a flowchart illustrating the operation of the critical-path analysis engine.

FIG. 10 is a flowchart illustrating the operation of the critical-path analysis engine. A critical path list is read at step 600, and an empty Assertion Network is constructed at step 601. A path is selected for processing at step 602. An on-pin and an off-pin is determined for each gate on the path, and then a local Boolean Difference function for each gate is computed, and the gate is placed in the Assertion Network (step 603). A back-trace is performed from each off-pin to a register output or Primary Input. All gates encountered during the trace are included, and then identical gates are merged (step 604). The outputs of the Boolean Difference gates are connected to the inputs of an AND gate. The output of the AND gate is connected to a Primary Output (PO) (step 605). Finally, if there are more paths to process, control returns to step 602, otherwise processing continues with FIG. 11.

Figure 11:
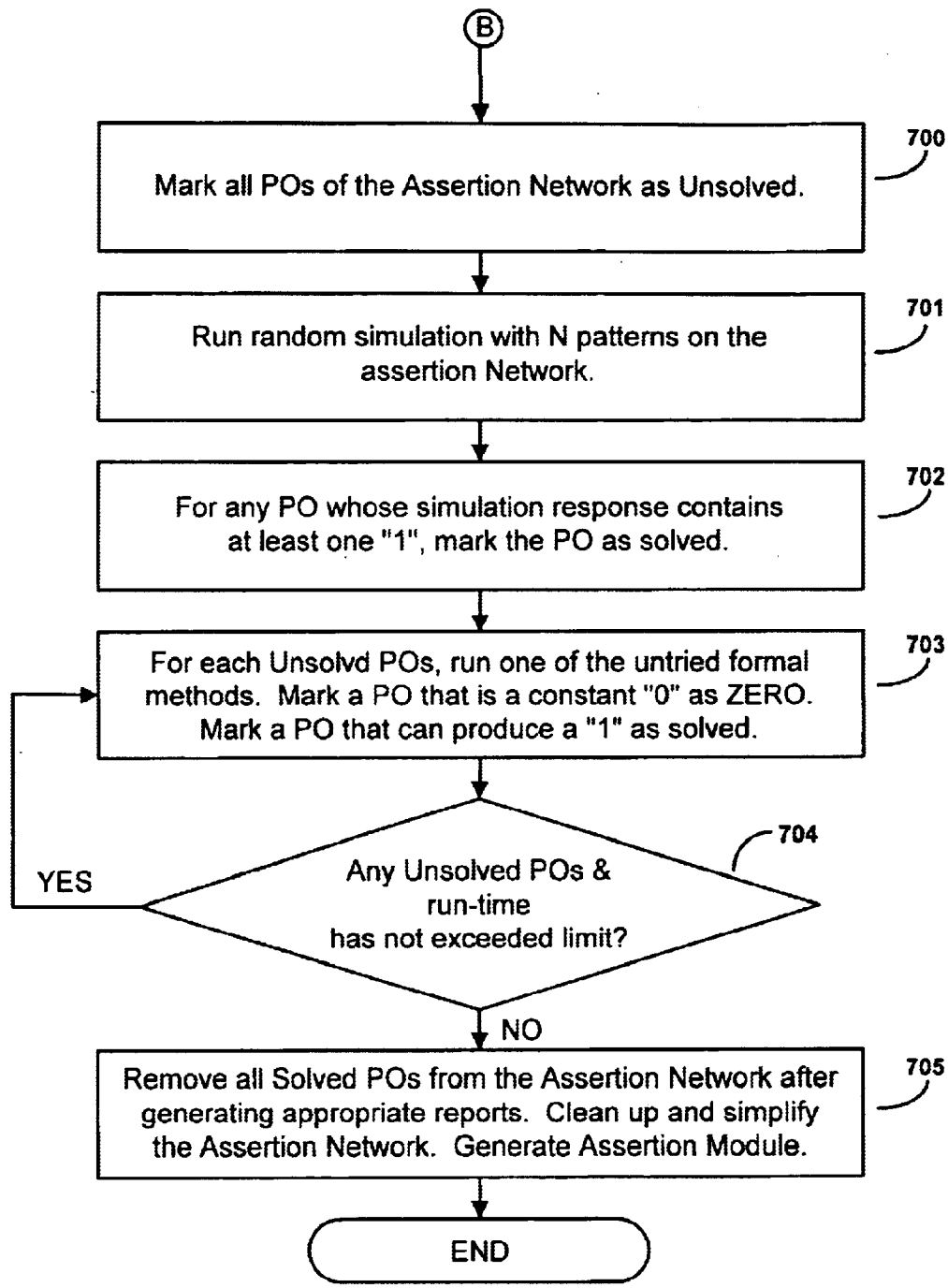
FIG. 11 is a flowchart illustrating the operation of the core Boolean solution network.

The core Boolean solution network will now be described in greater detail with reference to FIG. 11. All of the Primary Outputs (POs) are marked as unsolved in the Assertion Network (step 700). A simulation is run on the Assertion Network (step 701). If any PO has a simulation response that contains at least one "1", the PO is marked as solved (step 702). For each unsolved PO, run a different formal method, and any PO that is a constant "0" is marked as ZERO and any PO that produces a "1" is marked as solved (step 703). If there are any remaining unsolved POs, and a predetermined time limit has not been exceeded, then step 703 is repeated with a different formal method (step 704), otherwise appropriate reports are generated and all of the solved POs are removed from the Assertion Network. The Assertion Network is simplified and cleaned, and the Assertion Module is generated (step 705).

For purposes of illustration, the invention will now be described using Static Sensitization as the underlying signal propagation condition of the Binary difference (Bdiff) formulation. With Static Sensitization criteria, the algorithm detects logically redundant paths by assuming the signals not on the critical path reach their stable values before those on the critical path. However, the present technique is applicable to other sensitization criteria. For example, the floating mode criteria described in the following references, the disclosures of which are herein incorporated by reference, may also be used as the signal propagation conditions. P. C. Mcgeer, A. Saldanha, R. K. Brayton, and A. Sangiovanni-Vincentelli, "Delay models and exact timing analysis." *Logic Synthesis and Optimization*, pp. 167–189, T. Sasao, editor, Kluwar Academic Publishers, 1993; S. Devdas et al., "Computation of floating mode delay in combinational circuits: Theory and algorithms," IEEE Trans. On CAD, pp. 1913–1923, Jun., 1993; D. Du et al., "On the general false path problem in timing analysis," Proc. Of 26th DAC, pp. 555–560, 1989; P. C. Mcgeer and R. K. Brayton, "Integrating Functional and Temporal Domains in Logic Design," Kluwer Academic Publishers, 1991; and Y. Kukimoto, R. K. Brayton, "Exact Required Time Analysis via False Path Detection," Proc. Of 34th Design Automation Conference," pp. 220–225, Jun. 1997.

Since a particular path specified by a circuit designer may not start from a controlling point PI or end at an observable point PO, the calculation of the static sensitization conditions have been divided into three different parts: control network, observe network, and the Bdiff network.

A Bdiff network represents the condition under which a completely specified path can be statically sensitized. To compute this condition, the Boolean Difference at each logic gate in the path is calculated and the Bdiff network is the conjunction of these individual Boolean Difference operations. For example, for a path a-b-c-d that pass through pins x, y, z of logic gates F, G, H, the Bdiff network is:

$$Bdiff\ Network = \frac{\partial F}{\partial x} \cdot \frac{\partial G}{\partial y} \cdot \frac{\partial H}{\partial z}$$

Each term in the Bdiff Network is first computed for the function with respect to local support instead of the global functions, then backward traces are performed from the local support to the control points in order to provide the necessary global conditions.

The control network represents the conditions under which a path from any controlling point to a begin point can be activated. To compute the control network, a Boolean Difference is taken of the beginning point of the path with respect to each of the primary inputs or latches in the backward cone. Since the control network needs to evaluate to one when the begin point is sensitive to any control inputs, the disjunction of all the Boolean Differences is used. For example, if Z is a specified begin point and Z is a function of control inputs a, b, and c, then the control network is defined as:

$$ControlNetwork = \frac{\partial}{\partial a}Z + \frac{\partial}{\partial b}Z + \frac{\partial}{\partial c}Z$$

Similarly, to compute the observe network, a Boolean difference is taken of each of the primary outputs with respect to the end point of the path.
However, the network to be built for the computations is the fan-out cone from the end point and the fan-ins of the fan-outs. For example, if "a" is a specified end point and it can reach observable points Z1, Z2, and Z3, then the observe network is:

$$ObserveNetwork = \frac{\partial}{\partial a}Z1 + \frac{\partial}{\partial a}Z2 + \frac{\partial}{\partial a}Z3$$

The Bdiff network, the observe network and control network for each specified path are combined. A path is Statically Sensitizable if the conjunction of the three networks is satisfiable.

The basic Bdiff algorithms compute the logical conditions under which a path is statically sensitizable. However, timing paths also need to be considered when dealing with realistic timing domain problems. The timing paths are expanded topological paths where each topological arc is expanded into arcs with phases, e.g. topological arc (a→b) becomes (a rise→b rise), (a fall→b fall), (a fall→b rise), and (a rise→b fall). The extension is required because rising delays and falling delays of gates and wires may be unequal. It is also possible that the in-phase (out-phase) signal propagation is sensitizable while the out-phase (in-phase) propagation is not sensitizable. The present invention takes this into account as well.

To check the satisfiability of a path, any one of a number of known Boolean constraint solvers can be used. These includes BDD, SAT, TestGen, simulation, and other methods. The Boolean Satisfiability problem is NP-Complete and all proposed methods work well for some of the problems, while working poorly for others. In the present invention, a user may choose from a group of available solvers and can specify the order of execution of those solvers. A possible default order is:
1. Random Simulation
2. SAT solver
3. BDD
4. Structural TestGen Method The solvers are used to solve each of the problems in turn. When a particular solver yields a deterministic positive or negative answer to a problem, the remaining solvers are not used.

In one embodiment, the present invention produces assertion modules that contain Verilog primitive gates, i.e. AND, OR, NOR, NAND, XOR, XNOR, or NOT, when they can be identified as such. User Defined Primitives (UDPs) are used for the logic that the system fails to identify as primitives. An extension constructs the assertion logic by combining the sense formulation with the Bdiff formulation. The basic concept is that at each gate on the critical path, input arrival times and values are used to determine the conditions that will activate a path. When the on-input has a controlling value, the side inputs' logic values are set at controlling values with an arrival time no larger than the on-input arrival time. Then, a back-trace is performed from those side-inputs to determine the logical condition under which the conditions are true. When the on-input has a non-controlling value, the stable functions of those side-inputs are computed. The assertion logic is then the conjunction of these conditions.

Figure 12:
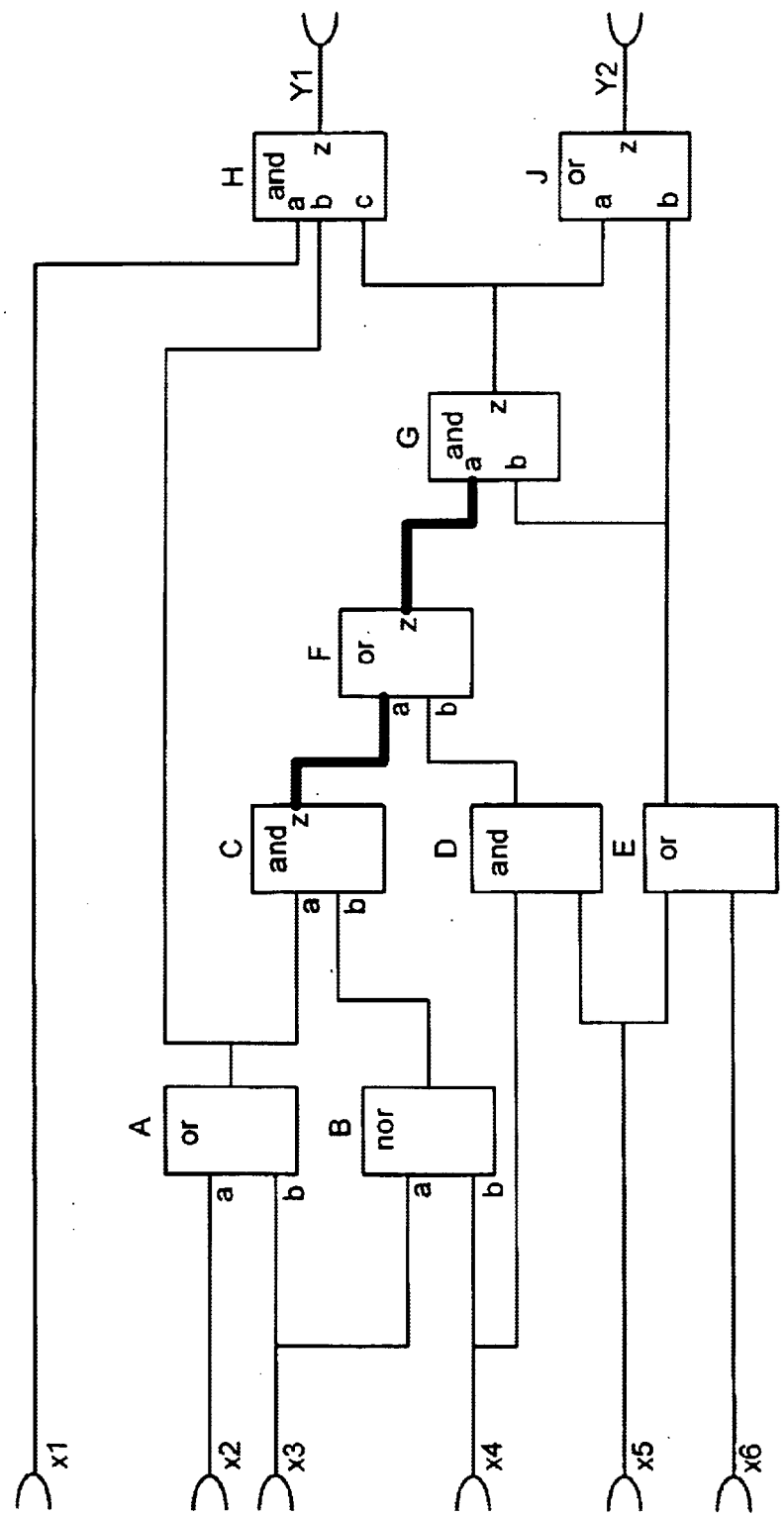
FIG. 12 is a circuit diagram used to illustrate the computation of a static sensitization condition of a specified DISABLE.
Figure 13:
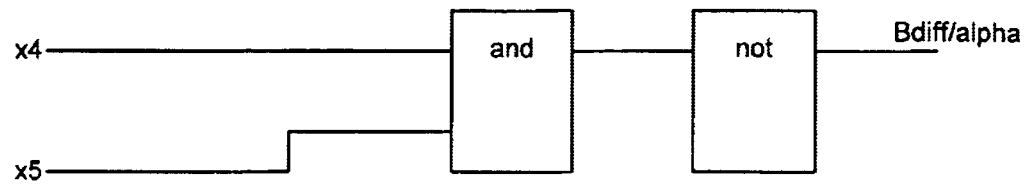
FIG. 13 shows an extracted Bdiff network of the circuit of FIG. 12.

FIG. 12 shows an example of computing the static sensitization condition of a specified DISABLE. In this example, a partial path named alpha (from C/z to G/a) is specified as false. In order to verify that specification, it must be proved that none of the paths that pass through C/z-F/a can be activated. To construct the assertion network for the alpha specification, the following steps are performed:

I. The Bdiff network is computed by the following steps:
1. Determine the on-paths from C/z to F/a. There are two on-paths, C/z Rise→F/a Rise→F/z Rise→G/a Rise and C/z Fall→F/a Fall→F/z Fall→G/a Fall. Since the specification covers all possible transitions from C/z to G/a, the edged path is combined into the edge-less path by dropping the edge qualifier. Thus, the on-path is C/z→F/a→F/z→G/a. The F/a pin is the only gate input pin that has a corresponding gate output pin on the on-path, thus gate F is the only on-gate.
2. For each on-gate, the local Boolean Difference function is computed. The Boolean Difference of F/z versus F/a is "not (F/b)." Therefore, a NOT gate is put with input F/b in the Assertion Network.
3. To express the Bdiff as a global function of primary inputs only, a back-trace is performed from F/b to the Primary Inputs or register output and all the gates and nets encountered are copied to the Assertion Network. FIG. 13 shows the extracted network. Note that Bdiff/alpha=not(X4 * X5).

II. Next, the ControlNetwork is constructed by computing the conditions under which a path from the beginning point of the on-paths is activated. The more general procedure is to compute edge-sensitive conditions. Since this example is edge-insensitive, the computation is carried out as:
1. Back-tracing from C/z produces the network Q=(X2+X3) * not(X3+X4).
2. For each Primary Input x, compute the Boolean Difference of Q versus x. thus, $$\frac{\partial Q_1}{\partial x2} = not(x3+x4); \quad \frac{\partial Q_1}{\partial x3} = x2*not(x4); \quad \frac{\partial Q_1}{\partial x4} = x2*not(X3).$$

Figure 14:
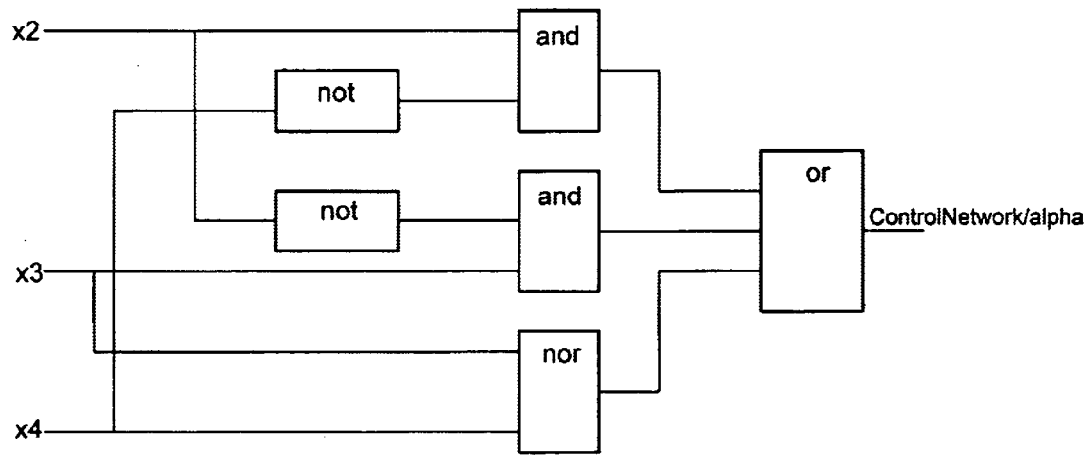
FIG. 14 shows a ControlNetwork for the circuit of FIG. 12.

3. Connect the outputs of the gates computed in the above step to an OR gate. FIG. 14 shows the ControlNetwork/alpha.

III. The Observe Network is computed as follows:
1. Forward trace from the end of the partial path to all Primary Outputs. In this example, forward trace from G/a to all primary outputs and mark gates G, H, and J.
2. Go through all paths that connect G/a and a Primary Output. For each gate on the path, compute the Boolean Difference function. The path from G/a to Y1 passes through two gates, G and H. For the G/a to G/z path the condition is G/b. For the H/c to H/z path, the condition is (H/a * H/b). These two conditions are then AND-ed together. Next the condition for path G/a to Y2 is constructed. The G/a to Y2 path passes through gates G and J. Since the local condition G/a to G/z has already been computed, the previous result is simply reused. The condition for the J/a to J/z path is J/b.

Figure 15:
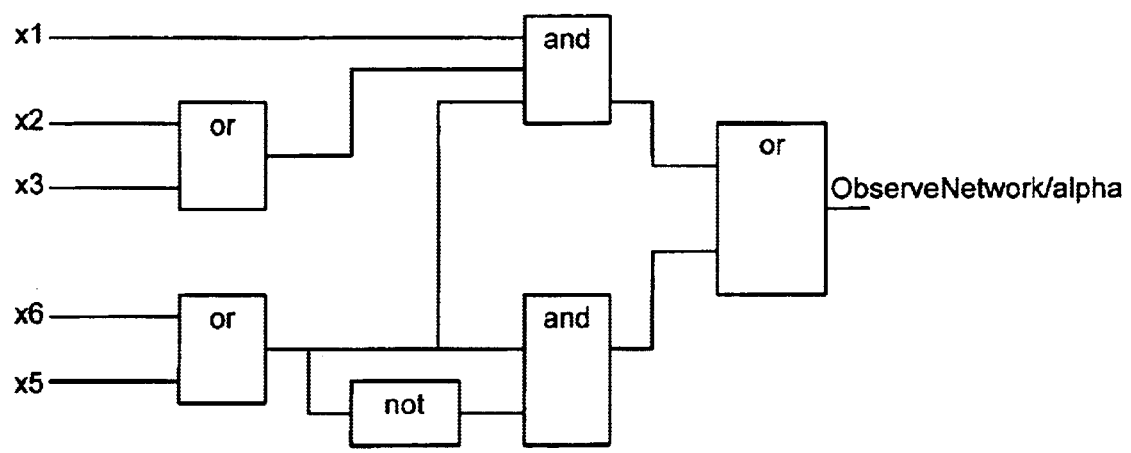
FIG. 15 shows an ObserveNetwork for the circuit of FIG. 12.

3. Next, an OR gate is created that has as its inputs the conditions computed from the previous stage.
4. Backtrace from all side inputs of the previously computed gates to the Primary Input. Include all the gates encountered in the Assertion Network. FIG. 15 shows the resulting ObserveNetwork.

Figure 16:
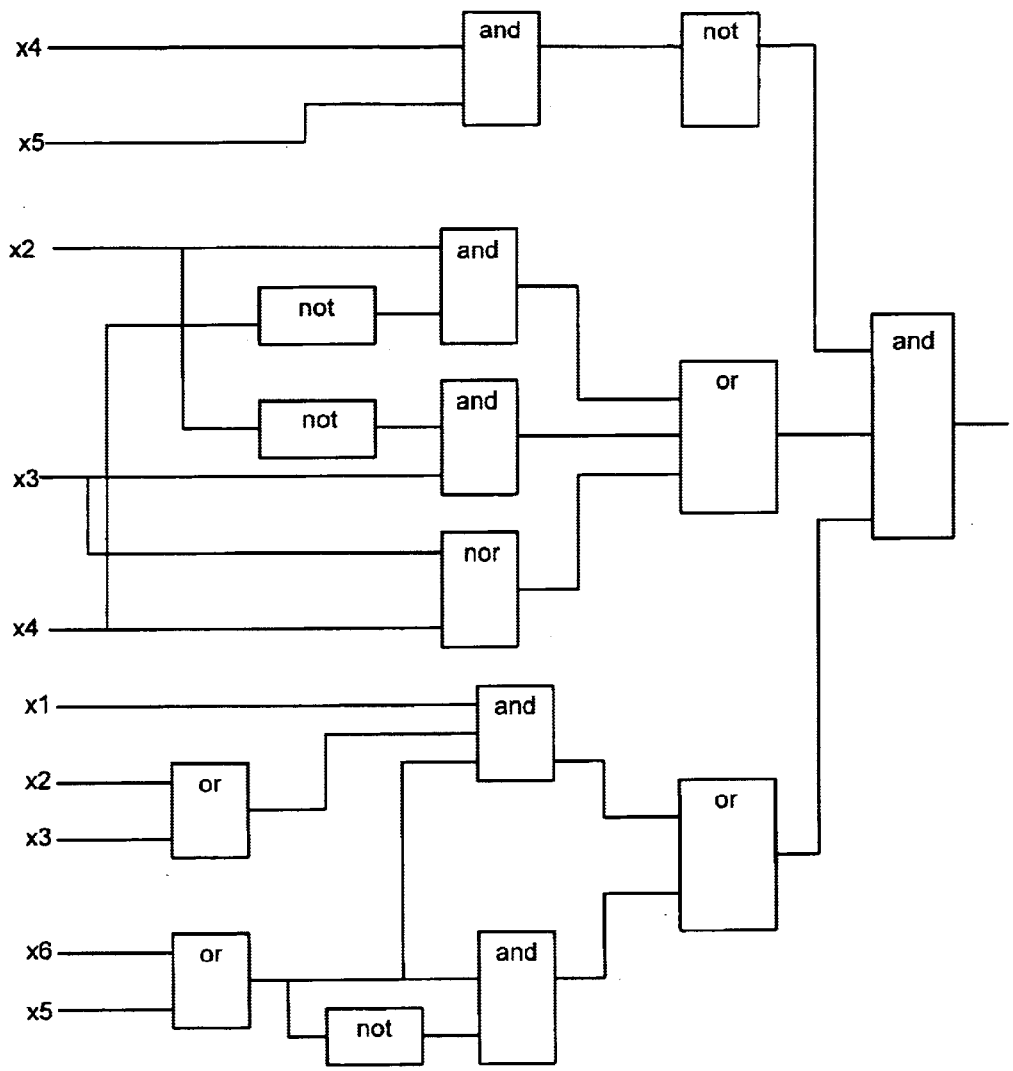
FIG. 16 shows the combined Bdiff, Control, and Observe Networks.

IV: Next, the Bdiff, Control, and Observe Networks are combined by connecting their outputs Bdiff/alpha, ControlNetwork/alpha, and ObserveNetwork/alpha to inputs of an AND gate. The output of the AND gate connects to a Primary Output of the Assertion Network. FIG. 16 shows the result.

V: The construction steps I–IV are repeated for each of the DISABLE specifications until there are no more specifications to process. The resulting Assertion Network contains all the logical conditions necessary to verify the DISABLE specifications. Each Primary Output corresponds to a particular DISABLE specification. The Assertion Network will then be simplified by a group of logic optimization steps, such as:
1. Merge common gates.
2. Remove logically redundant gates.
3. Absorb neighboring gates.

The primary purpose of the logic optimization is to make the following verification procedures more efficient. Depending on the characteristics of the verification procedure used, various types of logic optimization algorithms can be used in this step.

Figure 17:
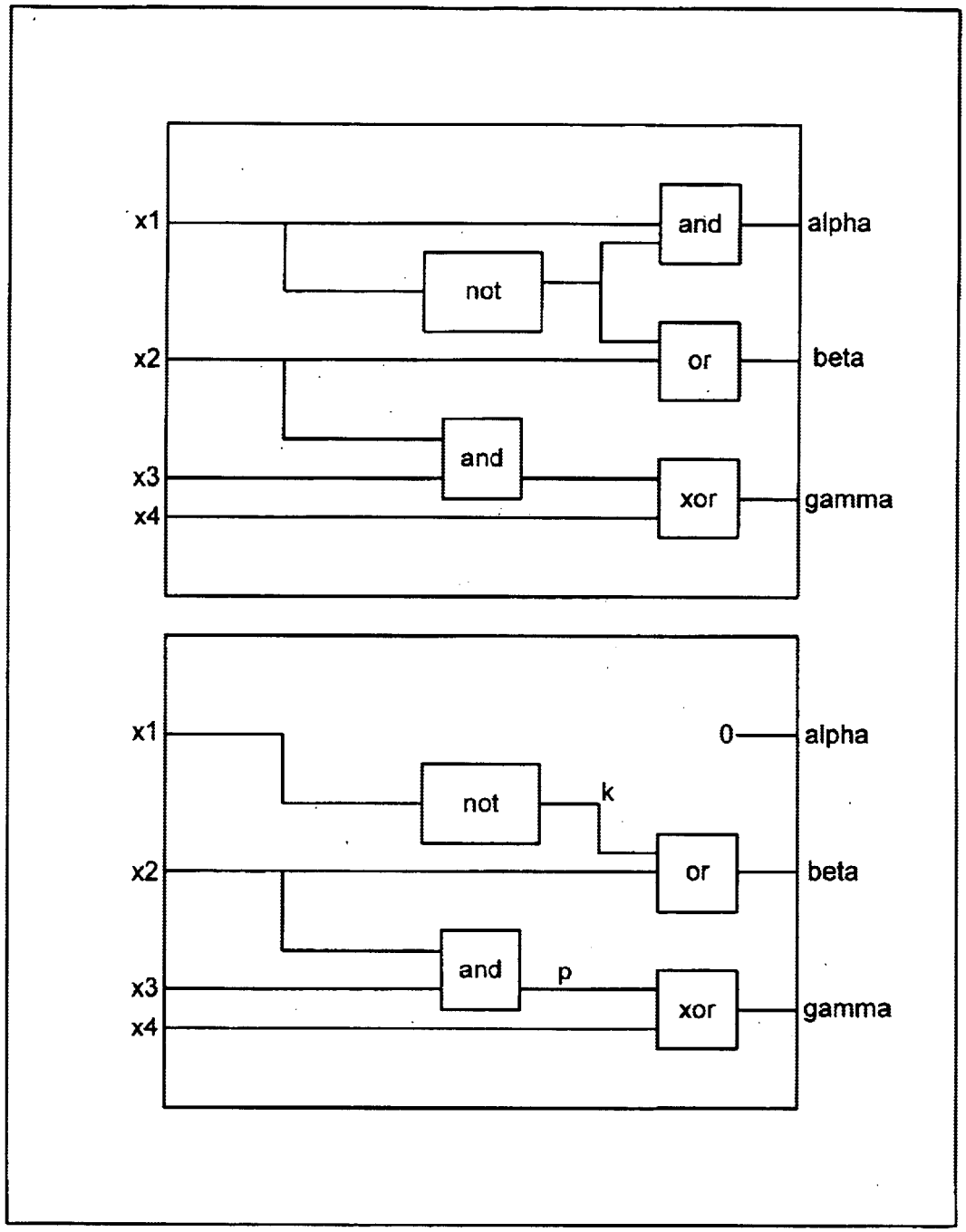
FIG. 17 illustrates an Assertion Network built from three DISABLE specifications, and the result after performing a tautology analysis.

VI: Next, a satisfiability checking algorithm, which checks whether a function can be a logic 1 for any input assignments, is run on each of the Primary Outputs of the Assertion Network. Examples of satisfiability algorithms include BDD and SAT. In essence, for each of the Primary Outputs, a determination is made whether there exists a set of Primary Input assignments that can make the Primary Output evaluate to TRUE (1). If there is not such an assignment, the DISABLE specification will be declared as correct and the gates in the backward cone that are not used by others will be removed from the Assertion Network. If there is at least one such input assignment, the network is kept for the following steps (VII–VIII). FIG. 17 illustrates an Assertion Network built from three DISABLE specifications, and the resulting Assertion Network formed upon completion of this step. For the specification alpha, no Primary Input assignment can make the Primary Output equal to 1, thus the DISABLE specification alpha is valid. For the specification beta, there is at least one input assignment (X2=1) that can make the Primary Output beta equal to 1. Therefore, the DISABLE specification beta is potentially invalid.

VII: The Assertion Network generated from step V is optimized for the Assertion Module creation. The optimization algorithm chosen will depend on the characteristics of the underlying simulator used for sequential verification.

VIII: Finally, an assertion module is generated from the Assertion Network. The assertion module may be represented in various forms. For example:
1. HDL, e.g. Verilog or VHDL.
2. A programming language, such as C or C++, having a simulator's programming language interface.

In the assertion module generation step, there may be user options to:
1. Control the number of times a particular message attached to each DISABLE specifications should be displayed.
2. Set whether to use the assertion module as the top simulation module, or as a sub-module of a user's simulation test-bench.

3. Set whether to report the simulation vectors that activate the paths.

FIG. 18 shows the assertion module in Verilog format, which displays each message twice, and the assertion module is set as the top module.

As described herein, the present invention has the following advantages over the timing simulation approach:
1. When a path is a combinational false path, the present method guarantees completeness. The prior art approaches tend to give up before finishing.
2. When a path is a combinational false path, the present method does not require user generated simulation test vectors.
3. The present method generates an assertion checking module that can be simulated at higher levels of design abstraction than in the prior art. By simulating a design at higher levels of abstraction, the design cycle-time can be drastically improved by taking advantage of the 3X–10X performance advantage of RTL versus gate level timing simulation.
4. The present method generates an assertion checking module that can be simulated without the consideration of device delays. The prior art needs to consider device delays during simulation, thus adding complexity and run-time to the design process.

The present invention has the following advantages over the prior art Functional Timing Analysis approach:
1. The prior art analytical approach cannot detect sequential false paths. The present method generates assertion checking modules that enable the detection of sequential false paths.
2. The prior art analytical approach will fail to produce an answer when the complexities and run-time exceeds the limits of the system. The present method produces assertion checking modules that can be used with alternative verification methods. Some possible verification techniques include random simulation, BDD (binary decision diagram), and SAT.

Those skilled in the art will appreciate that various adaptations and modifications of the just-described embodiments can be configured without departing from the scope and spirit of the invention. Therefore, it is to be understood that, within the scope of the appended claims, the invention may be practiced other than as specifically described herein.

What is claimed is:

1. A method for critical and false path verification, the method comprising:
   creating a Boolean expression F, which captures conditions that could make a potential false path true;
   performing a satisfiability test on F:
   if the satisfiability test finishes within a predetermined time period, and
   if F is not satisfiable, then F is a false path and processing ends;
   otherwise, if F is satisfiable, then the path is combinationally true, and F is simplified to an $F_{simplified}$ expression;
   if the satisfiability test does not finish within the predetermined time period, then F is simplified to an F' expression, which may contain register elements;
   performing a system simulation using either the $F_{simplified}$ or F' expression; and
   determining whether the $F_{simplified}$ or F' expressions can ever be true from the system simulation.

2. The method of claim 1, wherein the Boolean expression F is computed from only combinational elements.

3. The method of claim 2, wherein the system simulation is performed on both combinational and sequential elements.

4. The method of claim 3, wherein if either the $F_{simplified}$ or F' expression is true, then the path is true.

5. The method of claim 4, wherein the predetermined time period is user controllable.

6. The method of claim 4, wherein the satisfiability test is one of Random Simulation, SAT solver, BDD, and Structural TestGen Method.

7. The method of claim 6, wherein each satistiability test is executed in turn until a solution is found, or the predetermined time period expires.

8. The method of claim 4, wherein the Boolean expression comprises an Assertion Network.

9. The method of claim 8, wherein the Assertion Network comprises:
   a Bdiff Network;
   a ControlNetwork; and
   an ObserveNetworK.

10. The method of claim 9, wherein the Bdiff, Control and Observe networks are combined by connecting outputs of the networks to inputs of an AND gate.

11. The method of claim 10, wherein an output of the AND gate is connected to a Primary Output of the Assertion Network.

12. The method of claim 11, wherein the Assertion Network is then simplified.

13. An apparatus for critical and false path verification, the apparatus comprising:
   a disable processing unit;
   an internal core engine configured to build an Assertion Network;
   a critical-path analysis engine configured to compute a local Boolean Difference function for each gate in a path; and
   a Boolean solution network configured to run a simulation on the Assertion Network.

14. The apparatus of claim 13, wherein a list of disables, a list of critical paths, an HDL netlist and its associated cell library, and a device delay file are input to the apparatus.

15. The apparatus of claim 14, wherein the apparatus outputs an assertion module, a list of new disables, and a path report.

16. The apparatus of claim 13, wherein the internal core engine builds an Assertion Network comprising a Bdiff Network, a ControlNetwork, and an ObserveNetwork.

17. A method for processing a critical path comprising:
   determining an on-pin and an off-pin for each gate in the path;
   computing a local Boolean Difference function of each gate;
   placing each gate into an Assertion Network;
   back-tracing from each off-pin to a register output or a Primary input;
   including all gates encountered during back-tracing and then merging identical gates;
   attaching outputs of Boolean Difference gates to inputs of an AND gate; and
   attaching an output of the AND gate to a Primary Output of the Assertion Network.

18. The method of claim 17, further comprising:
   marking all Primary Outputs in the Assertion Network as unsolved;

running a simulation on the Assertion Network;

marking as solved any Primary Output whose simulation response contains at least one "1";

running a different formal method on each unsolved Primary Output; and marking as solved any Primary Output whose simulation response produces a "1".

19. The method of claim 18, further comprising:

running additional formal methods on any unsolved Primary Outputs until a predetermined time period has expired; and removing any solved Primary Outputs from the Assertion Network.

20. The method of claim 19, further comprising simplifying the Assertion Network and generating an Assertion Module.

21. The method according to claim 1, wherein:

said method is embodied in a set of computer instructions stored on a computer readable media;

said computer instructions, when loaded into a computer, cause the computer to perform the steps of said method.

22. The method according to claim 21, wherein said computer instruction are compiled computer instructions stored as an executable program on said computer readable media.

* * * * *